(12) United States Patent
Miyagawa et al.

(10) Patent No.: US 7,115,980 B2
(45) Date of Patent: Oct. 3, 2006

(54) MOUNTING STRUCTURE, ELECTRO-OPTICAL DEVICE, AND ELECTRONIC APPARATUS

(75) Inventors: Sakiko Miyagawa, Shiojiri (JP); Shinichi Kobayashi, Nagano (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 11/230,253

(22) Filed: Sep. 19, 2005

(65) Prior Publication Data
US 2006/0109394 A1 May 25, 2006

(30) Foreign Application Priority Data
Oct. 25, 2004 (JP) .............................. 2004-309131

(51) Int. Cl.
*H01L 23/02* (2006.01)

(52) U.S. Cl. ............... 257/678; 257/668; 257/E23.065; 257/E23.177

(58) Field of Classification Search ................ 257/678, 257/688, 689
See application file for complete search history.

(56) References Cited

U.S. PATENT DOCUMENTS

| | | | |
|---|---|---|---|
| 4,716,259 A | 12/1987 | Tokura et al. | |
| 5,763,940 A * | 6/1998 | Shibusawa et al. | 257/668 |
| 6,407,508 B1 * | 6/2002 | Kawada et al. | 315/169.3 |
| 6,486,544 B1 * | 11/2002 | Hashimoto | 257/686 |
| 6,670,700 B1 * | 12/2003 | Hashimoto | 257/686 |
| 6,762,942 B1 * | 7/2004 | Smith | 361/749 |
| 6,964,886 B1 * | 11/2005 | Kinsman | 438/125 |
| 2004/0150085 A1 * | 8/2004 | Takahashi et al. | 257/678 |
| 2005/0012199 A1 * | 1/2005 | Rosenau et al. | 257/696 |

FOREIGN PATENT DOCUMENTS

| | | |
|---|---|---|
| JP | 01232326 | 12/1989 |
| JP | 04075031 | 6/1992 |
| JP | 11317575 | 2/2000 |
| JP | 2003-324255 | 11/2003 |

OTHER PUBLICATIONS

Communication from European Patent Office regarding corresponding application.

* cited by examiner

*Primary Examiner*—Leonardo Andujar
*Assistant Examiner*—Krista Soderholm
(74) *Attorney, Agent, or Firm*—Harness, Dickey & Pierce, P.L.C.

(57) ABSTRACT

An electro-optical device includes: a first substrate having an end edge; a second substrate that has an edge crossing the end edge and a plurality of first wiring lines crossing the end edge, the second substrate having flexibility and being connected to the first substrate so as to overlap the end edge; and first reinforcing members provided on the second substrate so as to cross the end edge, in a region between the plurality of first wiring lines and a portion where the end edge and the edge cross each other.

16 Claims, 12 Drawing Sheets

MOUNTING STRUCTURE, ELECTRO-OPTICAL DEVICE, AND ELECTRONIC APPARATUS

BACKGROUND OF THE INVENTION

1. Technical Field

The present invention relates to a mounting structure having a flexible substrate, to an electro-optical device including the substrate, and to an electronic apparatus having the electro-optical device.

2. Related Art

In the related art, liquid crystal display devices have been used as a display device of an electronic apparatus such as a personal computer and a mobile phone. The liquid crystal display device includes a liquid crystal panel in which liquid crystal is sealed between a pair of substrates facing each other, and a flexible substrate overlapping an extending portion of one of the substrates extending from the other substrate. On the flexible substrate, wiring lines connected to electric wiring lines on the substrate of the liquid crystal panel are provided, and the flexible substrate is properly bent to be housed in a frame or the like which supports the liquid crystal panel. There is disclosed a technique in which dummy wiring lines are provided on a bending portion of a flexible substrate so as to prevent the flexible substrate and the wiring lines from being broken, when an external force is applied to the bent flexible substrate (for example, refer to Japanese Unexamined Patent Application Publication No. 2003-324255 (paragraph Nos. [0022], [0023], and [0024] and FIG. 1)).

However, in a case in which only the dummy wiring lines are provided on the bending portion of the flexible substrate, when an external force is applied to the flexible substrate, the flexible substrate and the wiring lines are broken at the portion (end edge) where the flexible substrate comes in contact with the substrate of the liquid crystal panel and the frame, because the substrate of the liquid crystal panel and the frame are hard.

In addition, in the above-described technique, dummy wiring lines are not provided so as to bridge the end edge of the substrate, between the wiring lines and the boundary between the flexible substrate and the side where the flexible substrate does not exist in the bending portion of the flexible substrate. Therefore, it is difficult to prevent the flexible substrate from being broken at the fragile boundary.

Further, when an opening is formed in the bending portion of the flexible substrate, the vicinity of the corner portions of the opening is not reinforced so as to bridge the end edge of the substrate in the above-described technique. Therefore, there is a problem in that the flexible substrate is broken at the corner portions of the opening causing the wiring lines on the flexible substrate to be easily broken.

SUMMARY

An advantage of the invention is that it provides a mounting structure capable of protecting wiring lines on a flexible substrate, an electro-optical device including the mounting structure, and an electronic apparatus including the electro-optical device.

According to an aspect of the invention, an electro-optical device includes: a first substrate having an end edge; a second substrate that has an edge crossing the end edge and a plurality of first wiring lines crossing the end edge, the second substrate having flexibility and being connected to the first substrate so as to overlap the end edge; and first reinforcing members provided on the second substrate so as to cross the end edge, in a region between the plurality of first wiring lines and a portion where the end edge and the edge cross each other.

Here, the first wiring lines are, for example, signal wiring lines, and the first reinforcing members are signal wiring lines or insulating members. In addition, the second substrate is referred to as a flexible substrate, for example.

In accordance with the invention, even though an external force is applied to the second substrate having flexibility, the first reinforcing members are provided between the plurality of wiring lines and the portion, where the end edge of the first substrate and the edge of the second substrate cross each other, so as to cross the end edge of the first substrate on the second substrate. Therefore, the region between the plurality of first wiring lines and the crossing portion can be reinforced by the first reinforcing members, so that the first wiring lines can be reliably prevented from being broken.

In the electro-optical device of the invention, preferably, the first reinforcing members are provided in the direction orthogonal to the direction along the end edge of the first substrate. Therefore, when the first reinforcing members are provided to be inclined in the direction along the end edge of the first substrate, the first reinforcing members are provided in the direction orthogonal to the direction along the end edge of the first substrate with respect to the second substrate which is easily broken along the inclination, so that the second substrate can be prevented from being broken along the inclined direction and the first wiring lines can be effectively prevented from being broken.

In the electro-optical device of the invention, preferably, the first reinforcing members are dummy wiring lines each having an island shape. Therefore, the plane area of the dummy wring line having an island shape is larger than that of the linear dummy wiring line, so that it can be reliably prevented that the second substrate is broken to break the first wiring lines.

In the electro-optical device of the invention, preferably, the first substrate has first terminals to be connected to the first reinforcing members, and the first reinforcing members, which are dummy wiring lines having second terminals to be connected to the first terminals, are formed to extend from the second terminals. Therefore, when the first substrate and the second substrate are connected to each other, the first terminals and the second terminals can be reliably connected through an adhesive or the like, and the first reinforcing members formed to extend from the second terminals can be used to reinforce the second substrate, which makes it possible to reduce manufacturing cost.

In the electro-optical device of the invention, preferably, the second substrate has an opening, and the edge is an open end of the opening. Therefore, the region between the plurality of first wiring lines and the portion where the edge of the opening of the second substrate and the end edge cross each other can be reinforced by the first reinforcing members. Accordingly, it can be prevented that the second substrate is broken from the region, where the edge of the opening and the end edge cross each other, to break the first wiring lines.

In the electro-optical device of the invention, preferably, the opening has an open end which is inclined with respect to the end edge and the plurality of first reinforcing members are provided such that ends thereof close to the open end are arranged along the inclined open end. The opening edge can be reinforced continuously along the inclination of the opening edge by means of the first reinforcing members to be arranged along the opening edge inclined to the end edge of the first substrate. Therefore, the opening edge of the opening is prevented from being broken, so that the first wiring lines can be prevented from being broken.

In the electro-optical device of the invention, preferably, the opening has corner portions and the first reinforcing members are provided in the vicinities of the corner portions. Even when the opening has the fragile corner portions, the first reinforcing members are provided in the vicinities of the corner portions. Therefore, the second substrate can be prevented from being broken from the corner portions by means of the first reinforcing members.

In the electro-optical device of the invention, preferably, the second substrate has a notched portion in a side edge of the second substrate, and the edge is an edge of the notched portion. Even when the second substrate has a notched portion, the first reinforcing members are provided between the plurality of first wiring lines and the portion where the edge of the notched portion and the end edge of the first substrate cross each other. Therefore, the first wiring lines can be prevented from being broken from the portion, where the edge of the notched portion and the end edge of the first substrate cross each other, by means of the first reinforcing members, and other external equipments can be provided so as to pass through the notched portion.

In the electro-optical device of the invention, preferably, the notched portion has corner portions and the first reinforcing members are provided in the vicinities of the corner portions. Even when the notched portion has fragile corner portions, the first reinforcing members are provided in the vicinities of the corner portions of the notched portion. Therefore, the second substrate can be prevented from being broken from the vicinities of the corner portions by means of the first reinforcing members.

In the electro-optical device of the invention, preferably, the electro-optical device further includes a frame that supports the first substrate and has an end edge; and second reinforcing members that are provided on the second substrate bent to overlap the end edge of the frame, in a region between the plurality of first wiring lines and a portion where the end edge of the frame and the edge cross each other, so as to cross the end edge of the frame. Even when an external force is applied to the second substrate, the second reinforcing members are provided on the second substrate so as to overlap the end edge of the frame, between the plurality of wiring lines and the crossing portion. Therefore, the region between the plurality of first wiring lines and the crossing portion can be reinforced, and it can be prevented that the second substrate is broken from the crossing portion to break the first wiring lines.

In the electro-optical device of the invention, preferably, the second reinforcing member is formed by extending the first reinforcing member. When the first reinforcing member and the second reinforcing member are separately provided, the region between the first reinforcing member and the second reinforcing member cannot be reinforced, but the second reinforcing member is formed by extending the first reinforcing member, so that the region between the first reinforcing member and the second reinforcing member can be reinforced. In addition, the pattern formation is simplified, thereby facilitating manufacturing processes.

In the electro-optical device of the invention, preferably, the electro-optical device further includes a third substrate that is connected to a side of the second substrate opposite to the other side thereof connected to the first substrate. Preferably, the second substrate is connected to overlap the end edge of the third substrate, and has third reinforcing members each located in a region between a portion, where the end edge of the third substrate and the edge of the second substrate cross each other, and the plurality of first wiring lines provided on the second substrate so as to cross the end edge of the third substrate. Even though an external force or the like is applied to the second substrate, the third reinforcing members are provided between the plurality of first wiring lines and the portion where the end edge of the third substrate and the edge of the second substrate cross each other. Therefore, the region between the plurality of first wiring lines and the crossing portion can be reinforced, and the crossing portion is prevented from being broken so that the first wiring lines can be prevented from being broken.

In the electro-optical device of the invention, preferably, the plurality of first reinforcing members are provided, and at least one of the first reinforcing members has a different width from those of the other first reinforcing members in the direction along the end edge. The width of the first reinforcing member which is close to the edge of the second substrate among the plurality of first reinforcing members is made larger than those of the first reinforcing members which are far from the edge, so that the vicinity of the fragile edge of the second substrate can be effectively and reliably prevented from being broken.

According to another aspect of the invention, an electro-optical device includes: a frame having an end edge; a substrate that has an edge crossing the end edge and a plurality of wiring lines crossing the end edge, the substrate having flexibility and being disposed in the frame so as to overlap the end edge; and reinforcing members provided on the substrate so as to cross the end edge, in a region between the plurality of wiring lines and a portion where the end edge and the edge cross each other.

Here, the wiring lines are signal wiring lines, and the reinforcing members are signal wiring lines or insulating members. In addition, the substrate is referred to as a flexible substrate.

In accordance with the invention, even though an external force is applied to the flexible substrate, the reinforcing members are provided on the substrate so as to cross the end edge of the frame, between the plurality of wiring lines and the crossing portion. Therefore, the region between the plurality of wiring lines and the crossing portion can be reinforced, so that it can be prevented that the substrate is broken from the crossing portion to break the wiring lines.

According to a still another aspect of the invention, a mounting structure includes: a substrate having an end edge; a substrate that has an edge crossing the end edge and a plurality of wiring lines crossing the end edge, the substrate having flexibility and being connected to the substrate so as to overlap the end edge; and reinforcing members provided on the substrate having flexibility so as to cross the end edge, in a region between the plurality of wiring lines and a portion where the end edge and the edge cross each other.

Here, the wiring lines are signal wiring lines, and the reinforcing members are signal wiring lines or insulating members. In addition, the substrate is referred to as a flexible substrate.

In accordance with the invention, even though an external force is applied to the flexible substrate, the reinforcing members are provided on the flexible substrate so as to cross the end edge of the substrate, between the plurality of wiring lines and the crossing portion. Therefore, the region between the plurality of wiring lines and the crossing portion can be reinforced, so that it can be prevented that the substrate is broken from the crossing portion to break the wiring lines.

According to a still further aspect of the invention, an electronic apparatus includes the above-described electro-optical device.

In accordance with the invention, there is provided the electro-optical device capable of preventing the first wiring lines of the second substrate having flexibility from being broken. Therefore, an electronic apparatus having excellent display performance can be obtained.

BRIEF DESCRIPTION OF THE DRAWINGS

The invention will be described with reference to the accompanying drawings, wherein like numbers reference like elements, and wherein.

DESCRIPTION OF THE EMBODIMENTS

Figure 1:
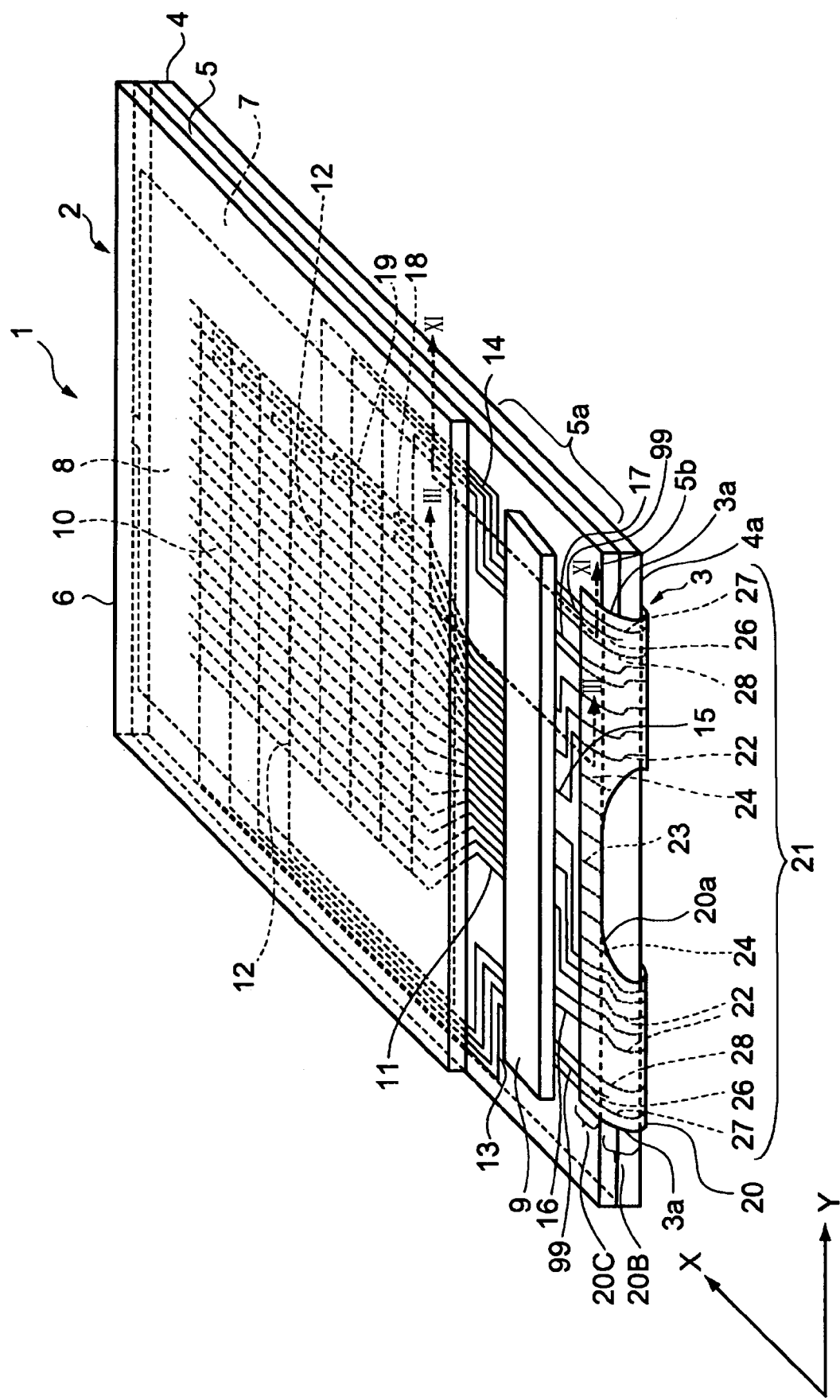
FIG. 1 is a schematic perspective view illustrating a liquid crystal display device of a first embodiment according to the invention.

Hereinafter, embodiments of the invention will be described with reference to the drawings. Moreover, in order to describe the embodiments below, a TFD (Thin Film Diode) active-matrix-type transflective liquid crystal display device will be exemplified as an electro-optical device, but the invention is not limited thereto. In addition, in order to make each component recognizable in the drawings, the reduced scale and the number of components in each structure are different from those in the actual structure.

First Embodiment

Figure 2:
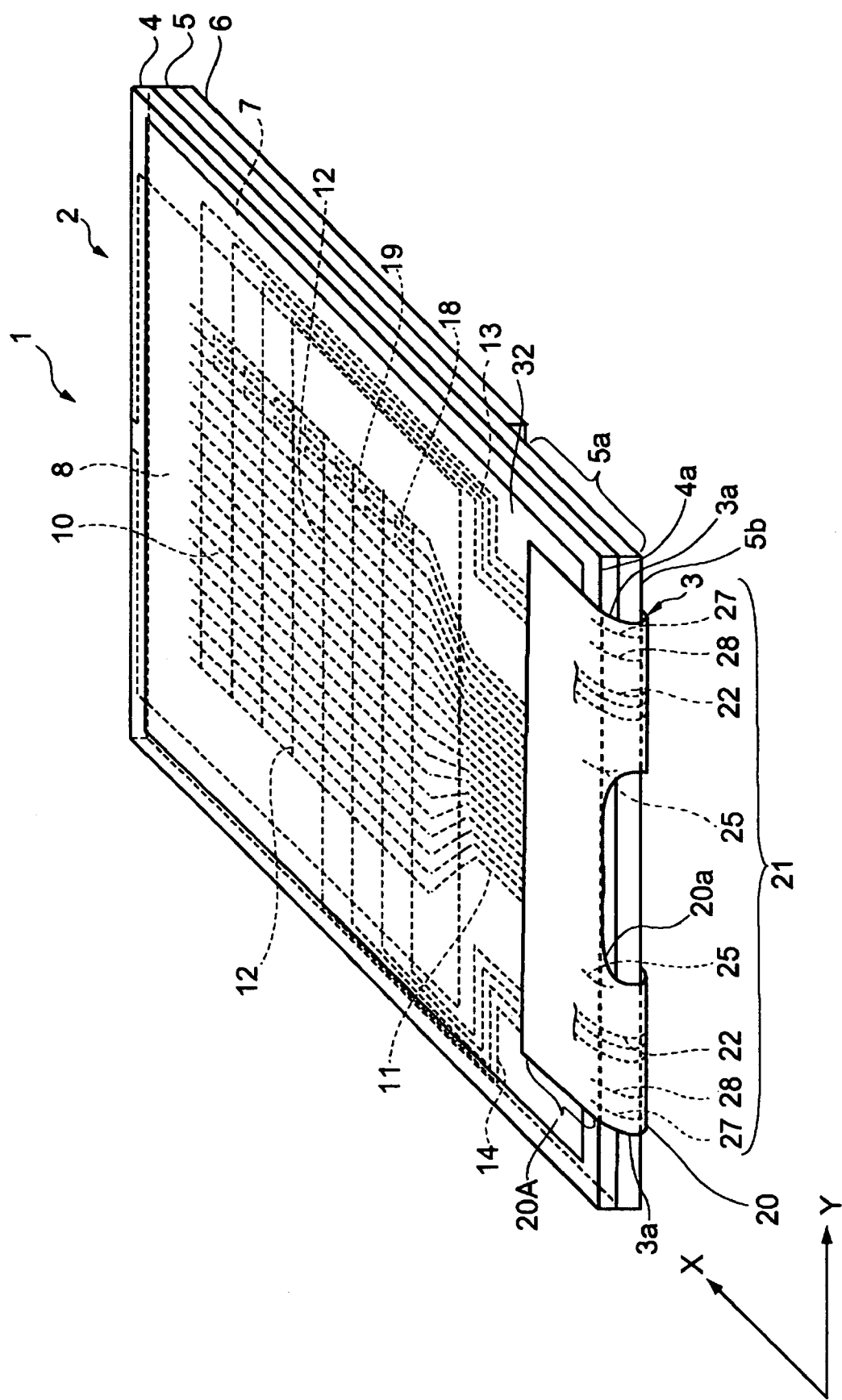
FIG. 2 is a schematic perspective view illustrating the liquid crystal display device of the first embodiment, seen from a bottom surface thereof.
Figure 3:
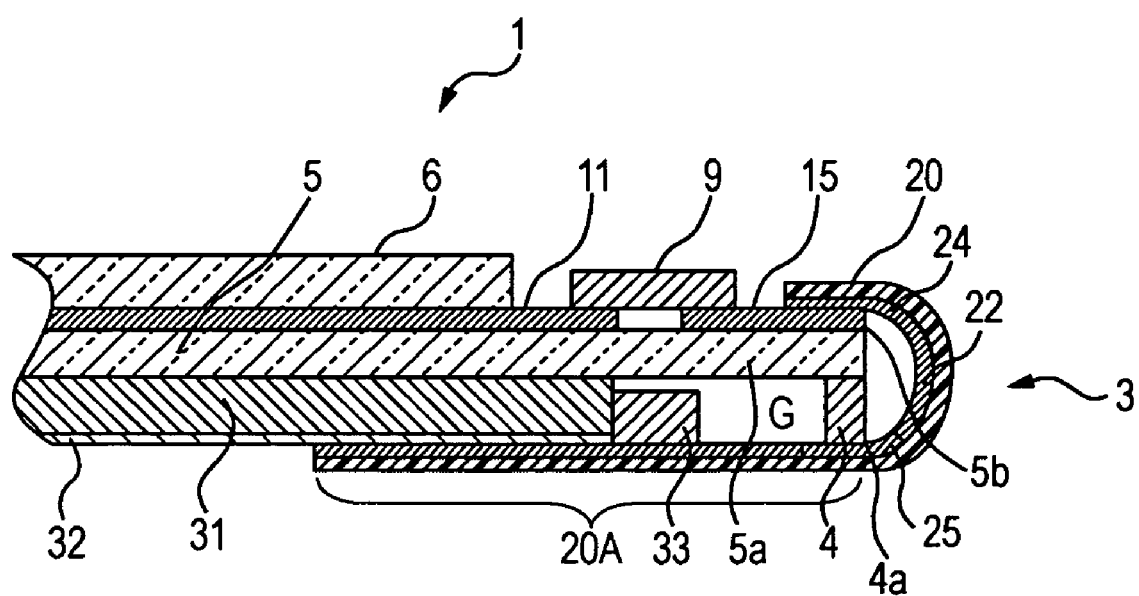
FIG. 3 is a cross-sectional view of the liquid crystal display device shown in FIG. 1 taken along the line III—III.

FIG. 1 is a schematic perspective view illustrating a liquid crystal display device of the first embodiment according to the invention. FIG. 2 is a schematic perspective view illustrating the liquid crystal display device, seen from the bottom surface. FIG. 3 is a cross-sectional view illustrating the liquid crystal display device shown in FIG. 1 taken along the line III—III.

The liquid crystal display device 1 of the present embodiment is provided with a liquid crystal panel 2, a circuit board 3 serving as a second substrate connected to the liquid crystal panel 2, and a frame 4 serving as a frame body which supports the liquid crystal panel 2. Moreover, other mechanisms to be described below, if necessary, are attached to the liquid crystal display device 1.

The liquid crystal panel 2 is provided with a rectangular substrate 5 serving as a first substrate, a substrate 6 provided to face the substrate 5, a sealing material 7 provided between the substrates 5 and 6, liquid crystal 8 sealed in a region surrounded by the substrates 5 and 6 and the sealing material 7, and a liquid crystal driving IC (Integrated Circuit) 9 provided on the substrate 5.

The substrate 5, which is rigid, is formed of a light-transmissive material such as glass, synthetic resin, or the like. The length of the substrate 5 in the X direction is set to be larger than that of the substrate 6, and the substrate 5 is provided with an extending portion 5a which extends from the end portion of the substrate 6. The substrate 5 is provided with stripe-shaped signal electrodes 10, wiring lines 11 for signal electrodes each of which one end is connected to the signal electrode 10, wiring lines 13 and 14 each of which one end is connected to a scanning electrode 12 provided on a surface of the substrate 6 facing the liquid crystal 8 through upper and lower conducting portions, the liquid crystal driving IC 9 connected to the other ends of the wiring lines 11, 13, and 14, wiring lines 15, 16, and 17 through which signals are input to the liquid crystal driving IC 9, and wiring lines 99 to be described below.

The plurality of signal electrodes 10 provided in the X direction are made of a conductive material such as metal or the like. The signal electrodes 10 are connected to a plurality of TFDs 18. The TFDs 18 are connected to rectangular pixel electrodes 19 corresponding to the TFDs 18. On the signal electrodes 10, an overcoat layer and an alignment layer, for example, are formed.

One end of each of the wiring lines for signal electrodes 11 is connected to the corresponding signal electrode 10, and the other ends thereof are connected to output terminals (not shown) of the liquid crystal driving IC 9 through an ACF (Anisotropic Conductive Film) or the like.

One end of each of the wiring lines 13 and 14 is connected to the scanning electrode 12 through upper and lower conducting portions (not shown), and the other ends are connected to output terminals (not shown) of the liquid crystal driving IC 9 through an ACF or the like.

As shown in FIGS. 1 and 3, the liquid crystal driving IC 9 provided on the extending portion 5a includes output terminals which are electrically connected to the wiring lines 11, 13, and 14 as described above and input terminals to be described below. Accordingly, the output signals from the output terminals of the liquid crystal driving IC 9 are transmitted to the signal electrodes 10 and the scanning electrodes 12 through the wiring lines 11, 13, and 14.

One end of each of the wiring lines 15 is connected to the corresponding input terminal of the liquid crystal driving IC 9 through an ACF or the like, and the other ends thereof are connected to wiring lines 22 on a FPC (Flexible Printed Circuits) substrate 20 of the circuit board 3, which will be described below, through an ACF or the like.

One end of each of the wiring lines 16 and 17 is connected to the corresponding input terminal of the liquid crystal driving IC 9 through an ACF or the like, and the other ends thereof are connected to the wiring line 22 on the FPC substrate 20 of the circuit board 3 through an ACF or the like.

One end of each of the wiring lines 99 is connected to the corresponding input terminal of the liquid crystal driving IC 9 through an ACF or the like, and the other ends thereof are connected to dummy wiring line 26 on the FPC substrate 20 of the circuit board 3, which will be described below, through an ACF or the like.

In addition, the substrate 6 is formed of a light-transmissive material such as glass or synthetic resin, and the plurality of scanning electrodes 12 are provided in the Y direction on the surface of the substrate 6 facing the substrate 5. The scanning electrodes 12 are made of a transparent conductive material such as ITO or the like to be connected to the wiring lines 13, which are provided on a surface of the substrate 6 facing the liquid crystal 8, through the upper and lower conductive portions. On the scanning electrodes 12, an overcoat layer and an alignment layer (not shown) are formed.

Moreover, the number of the signal electrodes 10 and the number of the scanning electrodes 12 can be properly changed according to the resolution or the size of display region of the liquid crystal panel 2.

The sealing material 7 is formed of thermosetting resin such as epoxy resin or the like in a frame shape so as to follow the contour of the substrate 6. An injection opening for injecting the liquid crystal 8 is formed by the substrates 5 and 6 and the sealing material 7. The injection opening is sealed by a sealing material (not shown).

The liquid crystal 8 is sealed inside the region surrounded by the substrates 5 and 6 and the sealing material 7, and TN (Twisted Nematic) liquid crystal, for example, is used.

As shown in FIGS. 1 to 3, the circuit board 3 includes the FPC substrate 20, which is connected to the substrate 5 and is bent to have flexibility, and a wiring group 21 provided on the FPC substrate 20.

Figure 4:
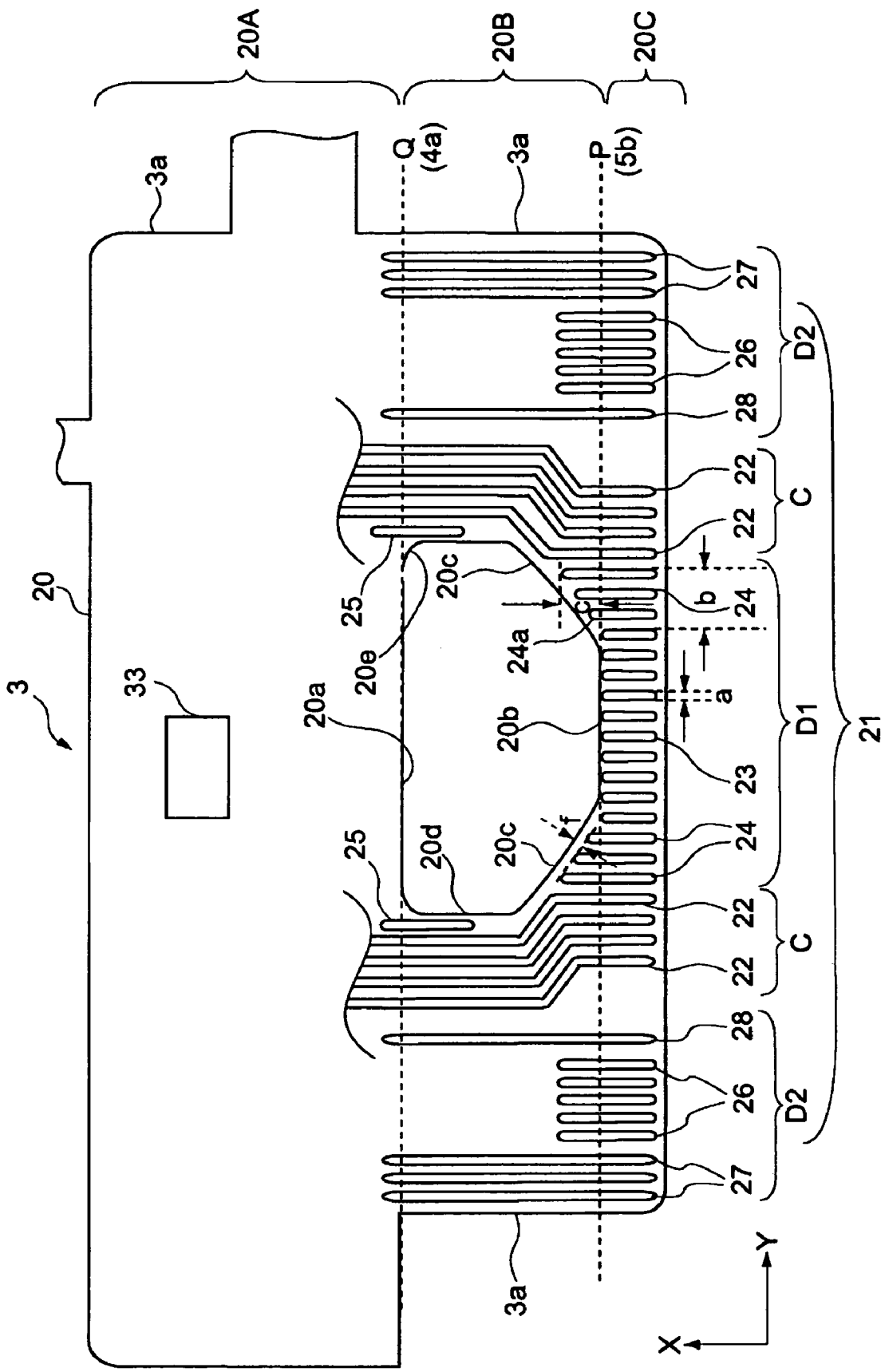
FIG. 4 is a schematic plan view illustrating a circuit board which is used in a liquid crystal panel shown in FIG. 1.

FIG. 4 is a schematic plan view illustrating the circuit board 3 which is used in the liquid crystal panel 2 shown in FIG. 1.

As shown in FIG. 4, the FPC substrate 20 includes a mounting portion 20A on which electronic components such as an LED 33 and the like are mounted, a bending portion 20B which is provided to be bent, and an end portion 20C which overlaps the substrate 5 to be connected thereto. A dotted line P indicates the position where the FPC substrate 20 abuts against the end edge 5b of the substrate 5 when the FPC substrate 20 is connected to the extending portion 5a of the substrate 5. A dotted line Q indicates the position where the FPC substrate 20 abuts against the end edge 4a of the frame 4 when the FPC substrate 20 is bent so that the mounting portion 20A overlaps the frame 4 at the bottom surface side of the frame 4. Moreover, the circuit board 3 may be provided so that the FPC substrate 20 abuts against those places only when an external force is applied to the circuit board 3 or the like. As a constituent material of the FPC 20, polyimide film, polyester, polypropylene, or the like is used.

On the mounting portion 20A, electronic components such as the LED 33 and the like are provided, and wiring lines are provided to be electrically connected to external equipments (not shown). As shown in FIG. 2, the mounting portion 20A is provided so as to be connected to the bottom surface of the frame 4 which will be described below.

In the bending portion 20B, an opening 20a is formed so that external members such as external equipments do not come in contact with the FPC substrate 20. The opening 20a is formed in a substantially hexagonal shape, and the peripheral edge of the opening includes an opening edge 20b which is substantially parallel to the Y direction, an inclined end edge 20c which is inclined so that the width of the opening 20a in the Y direction becomes narrow as the inclined end edge 20c approaches the end portion 20C of the circuit board 3 in the X direction, and an opening edge 20d which is substantially perpendicular to the opening edge 20b. At both corners of the opening 20a close to the mounting portion 20A in the Y direction, corner portions 20e are formed at a substantially right angle. Moreover, the shape of the opening 20a can be properly changed according to the shapes of external equipments to be inserted into the opening 20a, for example.

The end portion 20C is overlapped with and connected to the end of the substrate 5 of the liquid crystal panel 2 (refer to FIG. 1).

The wiring group 21 includes a conductive wiring group C, which is composed of wiring lines provided on the FPC substrate 20 to transmit electrical signals, and dummy wring groups D1 and D2 which are provided on the FPC substrate 20 so as to prevent the wiring lines of the conductive wiring group C from being broken.

The conductive wiring group C includes the plurality of wiring lines 22, which are disposed in both sides of the opening 20a along the Y direction, in a range from the end portion 20C to the mounting portion 20A through the bending portion 20B. Accordingly, when the circuit board 3 is connected to the liquid crystal panel 2, the wiring lines 22 are overlapped so as to cross the end edge 5b of the substrate 5 and the end edge 4a of the frame 4 (refer to FIGS. 1 and 2). As shown in FIG. 1, one end of each of the wiring lines 22 is connected to the wiring lines 15, 16, and 17 of the substrate 5 through an ACF (not shown). As shown in FIG. 2, the wiring lines 22 are bent toward the bottom surface side of the frame 4 along the bending portion 20B, so that the other ends thereof are connected to connectors for external connection (not shown). Therefore, the electrical signals from external equipments (not shown), for example, can be transmitted to the liquid crystal driving IC 9 through the wiring lines 22 or the like.

The dummy wiring group D1 includes dummy wring lines 23, 24, and 25. The width a in the direction orthogonal to the extending direction of the dummy wiring lines 23, 24, and 25 is set to 0.1 mm, for example.

As shown in FIG. 4, the longitudinal direction of the dummy wiring lines 23 is set to the X direction in the end portion 20C, and the respective ends of the dummy wiring lines 23 are provided at the same intervals in the Y direction along the dotted line P. Moreover, it is preferable that the shape of the opening 20a be made small in the X direction so that the opening edge 20b of the opening 20a is positioned at the bending portion 20B side rather than the dotted line P side, and the dummy wiring lines 23 are provided across the end portion 20C to the bending portion 20B to cross the dotted line P. This makes it possible to reinforce the opening edge of the opening and to prevent the circuit board 3 from being broken.

The plurality of dummy wiring lines 24 are arranged between the portion where the inclined end edge 20c and the end edge 5b cross each other and the wring lines 22 (between the plurality of wiring lines 22 and the plurality of dummy wiring lines 23). The portion is the boundary between the FPC substrate 20 and the place where the FPC substrate 20 does not exist. The plurality of dummy wiring lines 24 are provided so that ends 24a of the dummy wiring lines 24 close to the opening are arranged along the inclined end edge 20c. In other words, the lengths of the dummy wiring lines 24 in the X direction are adjusted so as to become gradually large from the dummy wiring lines 23 toward the wiring lines 22. Specifically, while the width of the place in the Y direction where the wiring lines 24 are provided is changed by a width b (refer to FIG. 4), the lengths of the dummy wiring lines 24 in the X direction are set to be changed by a length c. Here, the length c is referred to as a length of a portion which stretches from the dotted line P of the end portion 20C to the bending portion 20B side along the X direction. It is preferable that the width b is set to be in the range of 1.0 mm to 1.6 mm, and the length c is set to be more than 0.3 mm. Accordingly, by the dummy wiring lines 24, it can be reliably prevented that the circuit board 3 is broken from the side of the opening 20a to thereby break the wiring lines 22.

An interval f between the ends 24a of the dummy wiring lines 24 and the inclined end edge 20c is set to about 0.22 mm, for example. When the interval f is smaller than about 0.22 mm, the ends 24a of the dummy wiring lines 24 are easily peeled off, because a large stress is applied to the ends 24a of the dummy wiring lines 24 as they becomes close to the opening 20a. In contrast, when the interval f is larger than about 0.22 mm, the strength in the vicinity of the inclined end edge 20c is reduced, because a large interval is formed between the inclined end edge 20c and the ends 24a of the dummy wiring lines 24. Subsequently, with the interval f being set to 0.22 mm, the ends 24a of the dummy wiring lines 24 can be prevented from being peeled off, and the strength in the vicinity of the inclined end edge 20c can be sufficiently secured.

When the circuit board 3 is connected to the liquid crystal panel 2, the dummy wiring lines 24 are provided across the end portion 20C to the bending portion 20B so as to cross the end edge 5b of the substrate 5, as shown in FIG. 1. In this case, the end edge 5b of the substrate 5 abuts on the dummy wiring lines 24, as shown in FIG. 3. Between the wiring lines 22 and the portion where the inclined end edge 20c and the end edge 5b cross each other, the dummy wiring lines 24 are provided across the end portion 20C to the bending portion 20B so as to cross the end edge 5b.

In the present embodiment, it is exemplified that the straight line connecting the respective ends 24a of the dummy wiring lines 24 follows the inclined end edge 20c. However, the invention is not limited thereto. For example, other dummy wiring lines may be provided instead of the dummy wiring lines 24 or in addition to the dummy wiring lines 24, along the straight line connecting the respective ends 24a of the dummy wiring lines 24.

The dummy wiring lines 25 are provided in the vicinity (both sides) of the opening 20a across the mounting portion 20A to the bending portion 20B so as to cross the dotted line Q. In other words, the dummy wiring lines 25 are provided in the X direction which is substantially orthogonal to the end edge 5b between the wiring lines 22 and the portion where the opening edge 20d and the end edge 4a cross each other. When the circuit board 3 is provided to be connected to the substrate 5, the dummy wiring lines 25 are provided on the FPC substrate 20 so as to cross the end edge 4a of the frame 4. Moreover, the number and the shape of the dummy wiring lines 25 are not limited thereto. For example, the plurality of dummy wiring lines 25 may be provided in the vicinity (both sides) of the opening 20a, and the dummy wiring lines 25 may be provided in a substantial V shape (more specifically, 90°-inclined V shape) so as to follow the corner portion 20e of the opening 20a, which means that the number and the shape of the dummy wiring lines 25 can be properly changed according to a wiring pattern. Here, in the vicinity of the opening 20a, the interval between the opening edge 20d and the dummy wiring lines 25 in the Y direction is about 0.2 mm. When the circuit board 3 is connected to the liquid crystal panel 2, the dummy wiring lines 25 are provided in the vicinities of both sides of the opening 20a from the mounting portion 20A to the bending portion 20B so as to cross the end edge 4a of the frame 4, as shown in FIG. 2. In this case, the dummy wiring lines 25 are provided to abut on the end edge 4a of the frame 4, as shown in FIG. 3.

The dummy wiring group D2 includes the dummy wiring lines 26, 27, and 28.

Between the wiring lines 22 and the portion where the end edge 5b and an edge 3a cross each other, the dummy wiring lines 26 are provided across the end portion 20C to the bending portion 20B in the X direction orthogonal to the end edge 5b so as to cross the dotted line P. When the circuit board 3 is connected to the liquid crystal panel 2, the dummy wiring lines 26 are provided across the end portion 20C to the bending portion 20B side so as to cross the end edge 5b of the substrate 5, as shown in FIG. 1.

The dummy wiring lines 27, which are closer to the edge 3a than the dummy wiring lines 26, are provided in the X direction across the end portion 20C to the mounting portion 20A between the wiring lines 22 and the portion where the end edge 5b and the edge 3a cross each other and between the wiring lines 22 and the portion where the end edge 4a and the edge 3a cross each other, so as to cross the dotted lines P and Q.

The dummy wiring lines 28, which are closer to the wiring lines 22 than the dummy wiring lines 26, are provided in the X direction across the end portion 20C to the mounting portion 20A between the wiring lines 22 and the portion where the end edge 5b and the edge 3a cross each other and between the wiring lines 22 and the portion where the end edge 4a and the edge 3a cross each other, so as to cross the dotted lines P and Q. When the circuit board 3 is connected to the liquid crystal panel 2, the dummy wiring lines 27 and 28 are provided from the end portion 20C to the mounting portion 20A side through the bending portion 20B between the wiring lines 22 and the portion where the edge 3a and the end edge 5b cross each other and between the wiring lines 22 and the portion where the edge 3a and the end edge 4a cross each other, so as to cross the end edge 5b and the end edge 4a, respectively, as shown in FIGS. 1 and 2.

In the present embodiment, it is exemplified that the conductive wiring group C and the dummy wiring group D2 are respectively provided in both sides centered on the opening 20a. However, without being limited thereto, the conductive wiring group and the dummy wiring group may be provided asymmetrically left and right according to the positions of electronic components mounted on the mounting portion 20A and the position of the opening, for example. Moreover, the wiring lines 22 and the dummy wiring lines 23 to 28 are formed at the same time by a photolithographic method, for example. In addition, it is exemplified that the dummy wiring lines 24 are provided to abut on the end edge 5b of the substrate 5 and the dummy wiring lines 25 are provided to abut against the end edge 4a of the frame 4. However, the circuit board 3 may be provided to abut only when an external force is applied to the circuit board 3 or the like.

As shown in FIG. 3, the frame 4 is provided on the bottom surface of the substrate 5 so as to support the substrate 5. Inside the frame 4, for example, a light-guiding plate 31 is housed substantially parallel to the substrate 5. A reflecting plate 32 is connected to the mounting portion 20A of the circuit board 3 so as to overlap the light-guiding plate 31. On the mounting portion 20A, the LED (Light Emitting Diode) 33 is provided to be housed in the gap G which is defined at the bottom surface side of the extending portion 5a by the frame 4. This makes it possible to transmit the light emitted from the LED 33 into the substrates 5 and 6 through the light-guiding plate 31.

As such, for example, the liquid crystal driving IC 9 is mounted on the substrate 5 and the circuit board 3 is connected to the substrate 5, so that a mounting structure is formed.

According to the present embodiment, the dummy wiring lines 27 and 28 are provided on the circuit board 3 between the plurality of wiring lines 22 and the portion where the end edge 5b of the substrate 5 and the edge 3a of the circuit board 3 cross each other so as to cross the end edge 5b and the end edge 4a. Therefore, even though an external force or the like is applied to the circuit board 3, a region between the crossing portion and the plurality of wiring lines 22 can be reinforced by the dummy wiring lines 27 and 28, so that the wiring lines 22 can be reliably prevented from being broken.

Further, when dummy wiring lines are provided to be inclined in the X direction orthogonal to the end edge 5b, the circuit board 3 is easily broken along the inclination. In contrast, since the dummy wiring lines 23 to 28 are provided in the direction orthogonal to the end edge 5b, the circuit board 3 can be prevented from being broken along the inclined direction, so that the wiring lines 22 can be effectively prevented from being broken.

Furthermore, the opening 20a is formed on the FPC substrate 20. Between the plurality of wiring lines 22 and the portion where the end edge 5b of the substrate 5 and the inclined end edge 20c of the opening 20a cross each other, the dummy wiring lines 24 are provided on the circuit board 3 so as to cross the end edge 5b. Further, between the plurality of wiring lines 22 and the portion where the end edge 4a and the opening edge 20d of the opening 20a cross each other, the dummy wiring lines 25 are provided on the circuit board 3 so as to cross the end edge 4a. Therefore, a region between the opening 20a of the FPC substrate 20 and the wiring lines 22 can be reinforced by the dummy wiring lines 24 and 25, so that it can be prevented that the FPC substrate 20 is broken from the side of the opening 20a to thereby break the wiring lines 22.

In addition, the opening 20a has the inclined end edge 20c which is inclined with respect to the end edge 5b, and the plurality of dummy wiring lines 24 are provided so that the respective ends 24a thereof close to the opening 20a are arranged along the inclined edge 20c. Therefore, the inclined end edge 20c can be continuously reinforced along the inclination of the inclined end edge 20c by the dummy wiring lines 24, and the inclined end edge 20c of the opening 20a can be prevented from being broken so that the wiring lines 22 can be prevented from being broken.

Moreover, the liquid crystal display device 1 includes the frame 4 which supports the substrate 5 and has the end edge 4a. The circuit board 3 is bent so as to overlap the end edge 4a of the frame 4. Between the plurality of wiring lines 22 and the portion where the end edge 4a of the frame 4 and the edge 3 cross each other, the dummy wiring lines 25 are provided on the circuit board 3 so as to cross the end edge 4a of the frame 4. Therefore, even though an external force or the like is applied to the circuit board 3, the region between the plurality of wiring lines 22 and the crossing portion can be reinforced, so that it can be prevented that the circuit board 3 is broken from a portion crossing the frame 4 to thereby break the wiring lines 22.

Further, between a region where a group of dummy wiring lines 27 is provided and a region where another group of dummy wiring lines 27 is provided, the dummy wiring lines 26 and 28 are provided in the same manner as the dummy wiring lines 27. Therefore, even if the dummy wiring lines 27 are broken, the FPC substrate 20 can be prevented from being broken along the end edge 5b of the substrate 5 by the dummy wiring lines 26 and 28. In this case, the lengths of the dummy wiring lines 26 in the X direction are set to be smaller than those of the dummy wiring lines 27, and the plurality of dummy wiring lines 26 are provided along the Y direction. Therefore, the FPC substrate 20 can be further flexible as much as the lengths of reduced wiring lines, and the circuit board 3 can be prevented from being broken at the end edge 5b so that the wiring lines 22 can be prevented from being broken.

Furthermore, the plurality of liquid crystal display devices 1 of the present embodiment are manufactured. Then, with the liquid crystal display devices 1 mounted on electronic apparatuses, they are dropped hundreds of times from a predetermined height to perform an impact test. As a result, while the occurrence rate of defective display is 40% in the related art, the occurrence rate of defective display can be lowered to 0% in the liquid crystal display device 1 of the present embodiment. Therefore, it is proved that the wiring lines 22 can be protected by the dummy wiring lines 24, 25, and 27.

Second Embodiment

Next, a liquid crystal display device of the second embodiment according to the invention will be described. Moreover, in embodiments and modifications following the present embodiment, the same numerals are attached to the same constituent members as those of the above-described embodiment, and the descriptions thereof will be omitted. Different portions will be focused to be described.

Figure 5:
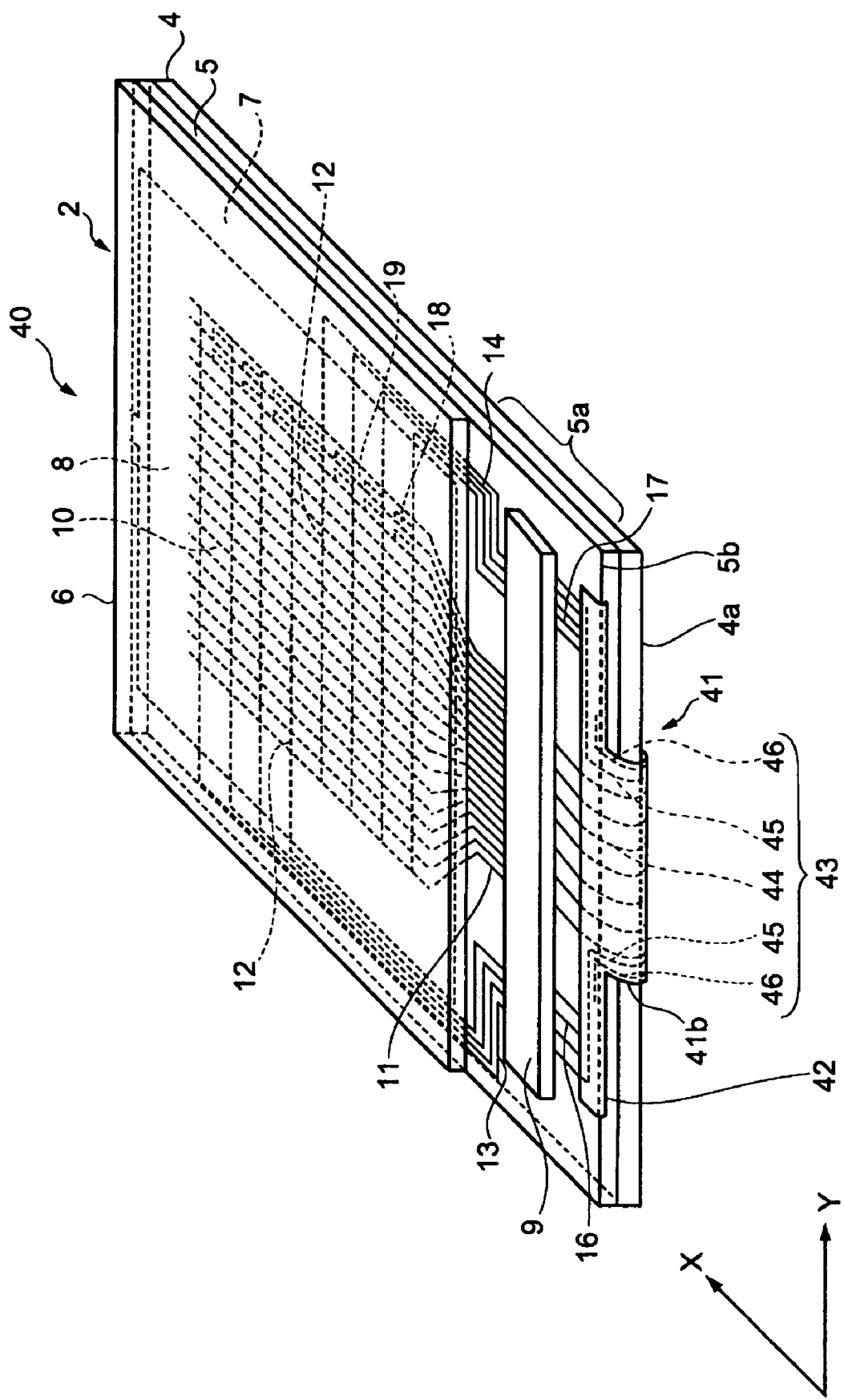
FIG. 5 is a schematic perspective view illustrating a liquid crystal display device of a second embodiment according to the invention.
Figure 6:
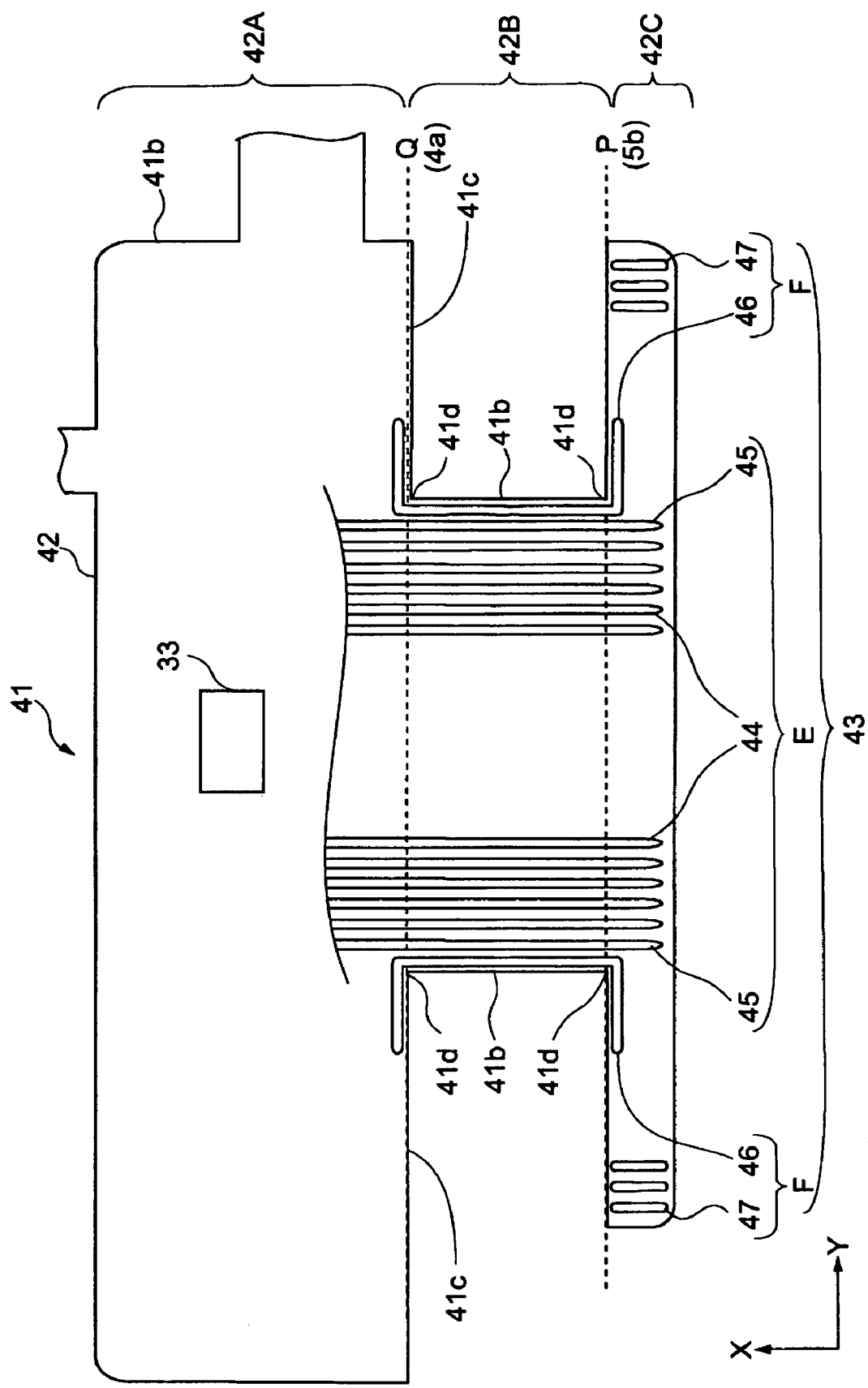
FIG. 6 is a schematic plan view illustrating a circuit board which is used in a liquid crystal panel shown in FIG. 5.

FIG. 5 is a schematic perspective view illustrating the liquid crystal display device of the second embodiment according to the invention, and FIG. 6 is a schematic plan view illustrating a FPC substrate which is used in a liquid crystal panel shown in FIG. 5.

In the liquid crystal display device 40 of the present embodiment, a circuit board 41 having a different shape from the circuit board 3 is used instead of the circuit board 3, as shown in FIG. 5.

The circuit board 41 includes a FPC substrate 42 and a wiring group 43 provided on the FPC substrate 42.

As shown in FIG. 6, the FPC substrate 42 includes a mounting portion 42A on which electronic components or the like are mounted, a bending portion 42B which is bent when the FPC substrate 42 is connected to the liquid crystal panel 2, and an end portion 42C to be connected to the substrate 5. The width of the bending portion 42B in the Y direction is set to be narrower than those of the end portion 42C and the mounting portion 42A in the Y direction, because a notched portion 41c is formed in the FPC substrate 42. Accordingly, when external equipments are provided so as to pass through the notched portion 41c, the FPC substrate 42 can be set so as not to come into contact with external members of external equipments, and the flexibility of the FPC substrate 42 can be secured. In the notched portion 41c, substantially right-angled corner portions 41d are formed in the vicinities of dotted lines P and Q.

As shown in FIG. 6, the wiring group 43 includes a conductive wiring group E through which the electrical signals from external equipments (not shown) are transmitted to the liquid crystal driving IC 9 and a dummy wiring group F by which the conductive wiring group E is prevented from being broken.

The conductive wiring group E includes wiring lines 44 and 45 which are provided across the end portion 42C to the mounting portion 42A through the bending portion 42B so as to cross the dotted lines P and Q. The wiring lines 44 are connected to the wiring lines 15 as described above, and the wiring lines 45 are connected to the wiring lines 16 and 17, respectively, as described above.

The dummy wiring group F includes dummy wiring lines 46, which are bent across the end portion 42C to the mounting portion 42A so as to follow the corner portions 41d in the vicinities of the corner portions 41d between the wiring lines 45 and the portion where a side edge 41b and the end edge 5b cross each other and between the wiring lines 45 and the portion where the side edge 41b and the end edge 4a cross each other, and a plurality of dummy wiring lines 47 provided in the X direction orthogonal to the end edge 5b on the end portion 42C. In the vicinity of the corner portion 41d, the interval between the corner portion 41d and the dummy wiring lines 46 in the Y direction is about 0.2 mm, for example.

According to the present embodiment, the notched portion 41c is formed in the circuit board 41, and the dummy wiring lines 46 are provided between the wiring lines 45 and the portion where the side edge 41b of the notched portion 41c and the end edge 5b (the dotted line P) cross each other and between the wiring lines 45 and the portion where the side edge 41b of the notched portion 41c and the end edge 4a (the dotted line Q) cross each other. Therefore, even when the notched portion 41c is formed in the circuit board 41, the wiring lines 45 or the like can be prevented from being broken from the side of the notched portion 41c by means of the dummy wiring lines 46, and other external equipments can be provided so as to pass through the notched portion 41c. As such, the shape of the circuit board 41 is not limited thereto but can be properly changed according to the positional relationship with external equipments.

Further, even when fragile corner portions 41d are formed in the notched portion 41c, the circuit board 41 can be prevented from being broken from the vicinities of the corner portions 41d by means of the dummy wiring lines 46, because the dummy wiring lines 46 are to be bent along the corner portions 41d in the vicinities of the corner portions 41d.

Third Embodiment

Next, a liquid crystal device of the third embodiment according to the invention will be described.

Figure 7:
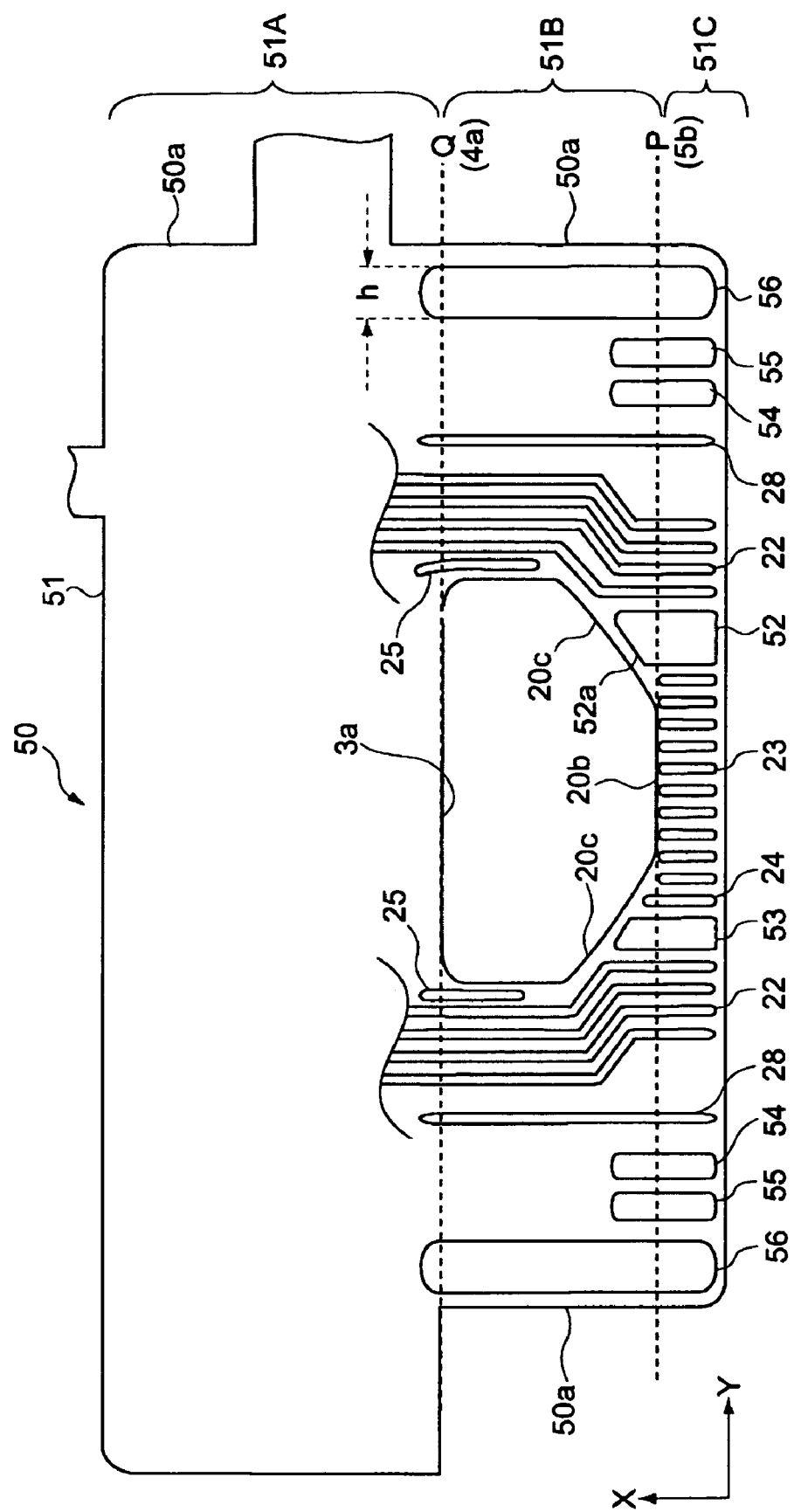
FIG. 7 is a schematic plan view illustrating a circuit board which is used in a liquid crystal display device of a third embodiment according to the invention.

FIG. 7 is a schematic plan view illustrating a circuit board which is used in the liquid crystal display device of the present embodiment.

The liquid crystal display device of the present embodiment is an example in which a circuit board 50 is used instead of the circuit board 3. On the circuit board 50, dummy wiring lines are provided to have different widths in the direction crossing the extending direction thereof.

The circuit board 50 includes a FPC substrate 51 composed of a mounting portion 51A, a bending portion 51B, and an end portion 51C, similar to the above-described embodiment. Further, the circuit board 50 includes dummy wiring lines 52, 53, 54, 55, and 56 which have different widths from the above-described wiring lines in the Y direction crossing the extending direction.

The dummy wiring line 52, which is provided in an island shape (plate table shape) in place of the dummy wiring lines 24 of the first embodiment, includes an inclined edge 52a provided to be substantially parallel to an inclined end edge 20c. The width of the dummy wiring line 52 in the Y direction crossing the extending direction thereof is set to be six times larger than those of the dummy wiring lines 24.

The dummy wiring line 53 is provided in a island shape in place of the dummy wiring lines 24 of the first embodiment, and the width of the dummy wiring line 53 in the Y direction is set to be three times larger than those of the dummy wiring lines 24 of the first embodiment, which means that the widths of the dummy wiring lines 24 in the Y direction are different from that of the dummy wiring line 53.

The dummy wiring lines 54 and 55 are provided in an island shape in place of the dummy wiring lines 26, and the widths thereof in the Y direction are set to be three times larger than the widths a of dummy wiring lines 23, respectively.

The dummy wiring lines 56, which are provided in an island shape in place of the dummy wiring lines 27, are provided across the end portion 51C to the mounting portion 51A through the bending portion 51B in the vicinity of the edge 50a of the bending portion 51B of the circuit board 50 so as to cross the dotted lines P and Q. The width h of the dummy wiring line 56 in the Y direction is set to be five times larger than the width a.

Moreover, in order to prevent the wiring lines 22 from being broken, it is preferable that the widths of all the dummy wiring lines be made large to such an extent that the flexibility of the FPC substrate 20 is not hindered. However, since the wiring lines 22 and the like are disposed at narrow pitches, the widths of all the wiring lines in the Y direction cannot be made thick. For example, the widths of the dummy wiring lines 27 or the like, which are required to be reinforced, are made thick, and the dummy wiring lines 28 or the like are set to have the same widths as the dummy wiring lines 23.

According to the present embodiment, the width h of the dummy wiring line 56 in the Y direction is set to be large, which is different from the widths a of the dummy wiring lines 24, and the dummy wiring lines 56 and the like have a island shape. Therefore, a portion where the fragile edge 50a of the circuit board 50 and the fragile end edge 5b cross each other and a portion where the edge 50a and the end edge 4a cross each other are effectively prevented from being broken, and the wiring lines 22 are reliably prevented from being broken.

Further, the dummy wiring lines 24, 52, and 53 have different widths from each other in the Y direction. In other words, since the dummy wiring lines 52 and 53 are formed in an island shape, the widths of the dummy wiring lines 52 or the like can be made larger (the area is made large) than the linear dummy wiring lines, and the fragile portions can be intensively reinforced. Accordingly, such a liquid crystal display device as is hardly broken and has excellent performance can be obtained. Moreover, as the widths of the wiring lines 56 close to the portion where the edge 50a and the end edge 5b, which are easily broken by an external force, cross each other are preferentially made thick, the wiring lines 22 can be more reliably reinforced.

Fourth Embodiment

Next, a liquid crystal display device of the fourth embodiment according to the invention will be described.

Figure 8:
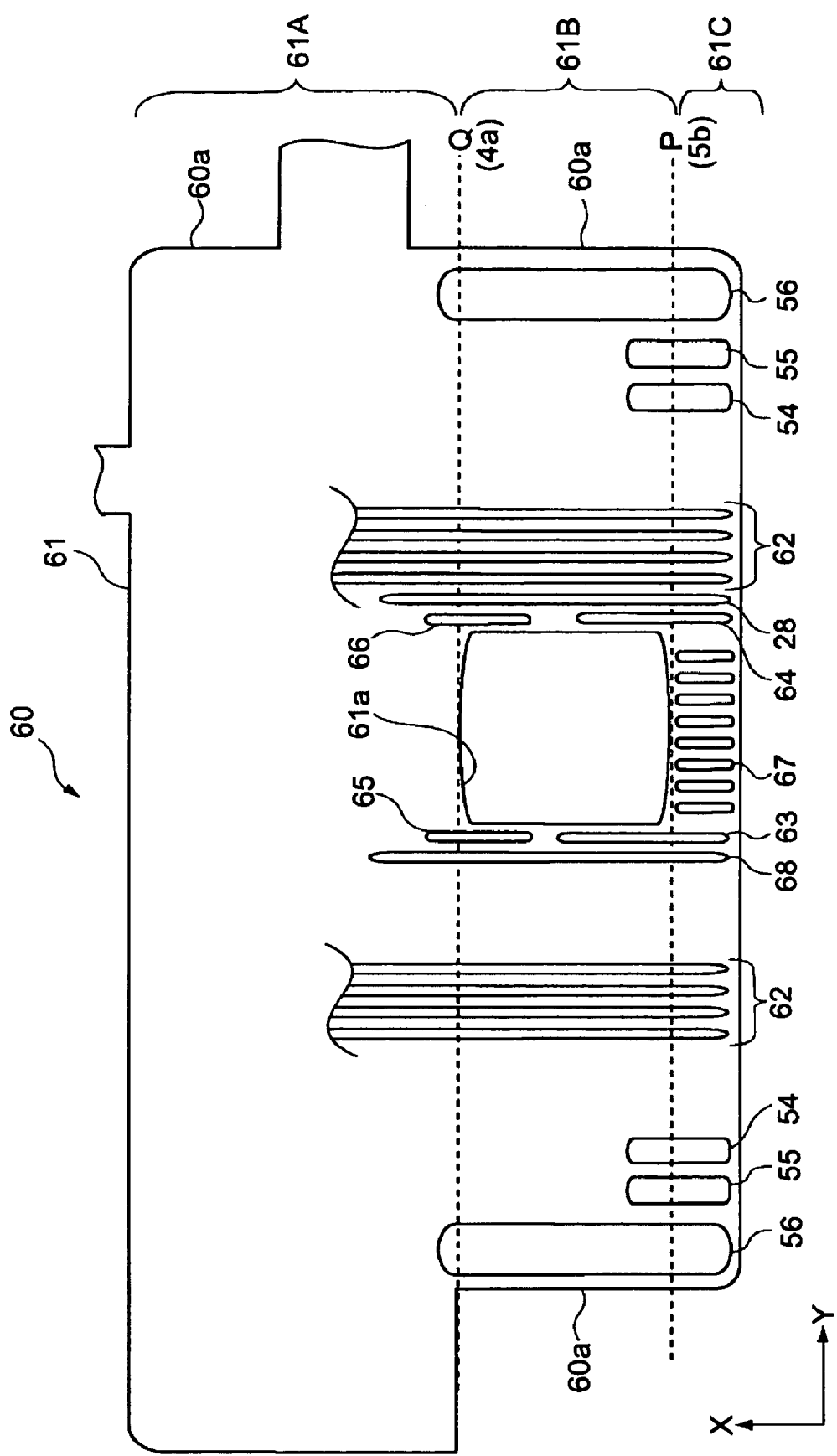
FIG. 8 is a schematic plan view illustrating a circuit board which is used in a liquid crystal display device of a fourth embodiment according to the invention.

FIG. 8 is a schematic plan view of a circuit board which is used in the liquid crystal display device of the fourth embodiment.

In the liquid crystal display device of the present embodiment, it is exemplified that a circuit board 60, in which an opening is formed in a different position, is used instead of the circuit board 41 of the second embodiment.

The circuit board 60 includes a FPC substrate 61 including the same mounting portion 61A, the same bending portion 61B, and the same end portion 61C as those of the above-described embodiment.

In the bending portion 61B, an opening 61a having a substantially rectangular shape is formed at the position deviating from a center of the circuit board 60 in the Y direction. At both sides of the opening 61a in the Y direction, wiring lines 62 are formed across the end portion 61C to the mounting portion 61A through the bending portion 61B so as to cross the dotted lines P and Q.

Between the wiring lines 62 and the portion where the opening edge of the opening 61a and the end edge 5b cross each other, dummy wiring lines 63 and 64 are provided. The dummy wiring lines 63 and 64 are provided from the end portion 61C to the bending portion 61B so as to cross the dotted line P. Between the wiring lines 62 and the portion where the opening edge of the opening 61a and the end edge 4a cross each other, dummy wiring lines 65 and 66 are provided. The dummy wiring lines 65 and 66 are provided from the bending portion 61B to the mounting portion 61A so as to cross the dotted line Q. In the end portion 61C, a plurality of dummy wiring lines 67 are provided between the dummy wiring lines 63 and 64. Even though the dummy wiring lines 67 are provided in the X direction in the end portion 61C, it is preferable that they extend to the bending portion 61B so as to cross the dotted line P. Accordingly, the edge of the opening 61a can be more reliably reinforced.

According to the present embodiment, the opening 61a, into which external equipments are to be inserted, is provided at the position deviating from the center in the Y direction. Even in this case, however, the dummy wiring lines 63 and 64 are provided between the wiring lines 62 and the portion where the opening edge of the opening 61a and the end edge 5b cross each other, and the dummy wiring lines 65 and 66 are provided between the wiring lines 62 and the portion where the opening edge of the opening 61a and the end edge 4a cross each other. Therefore, the wiring lines 62 can be reinforced from the side of the opening 61a. As such, the wiring lines 62 can be prevented from being broken, regardless of the position of the opening.

First Modification

Figure 9:
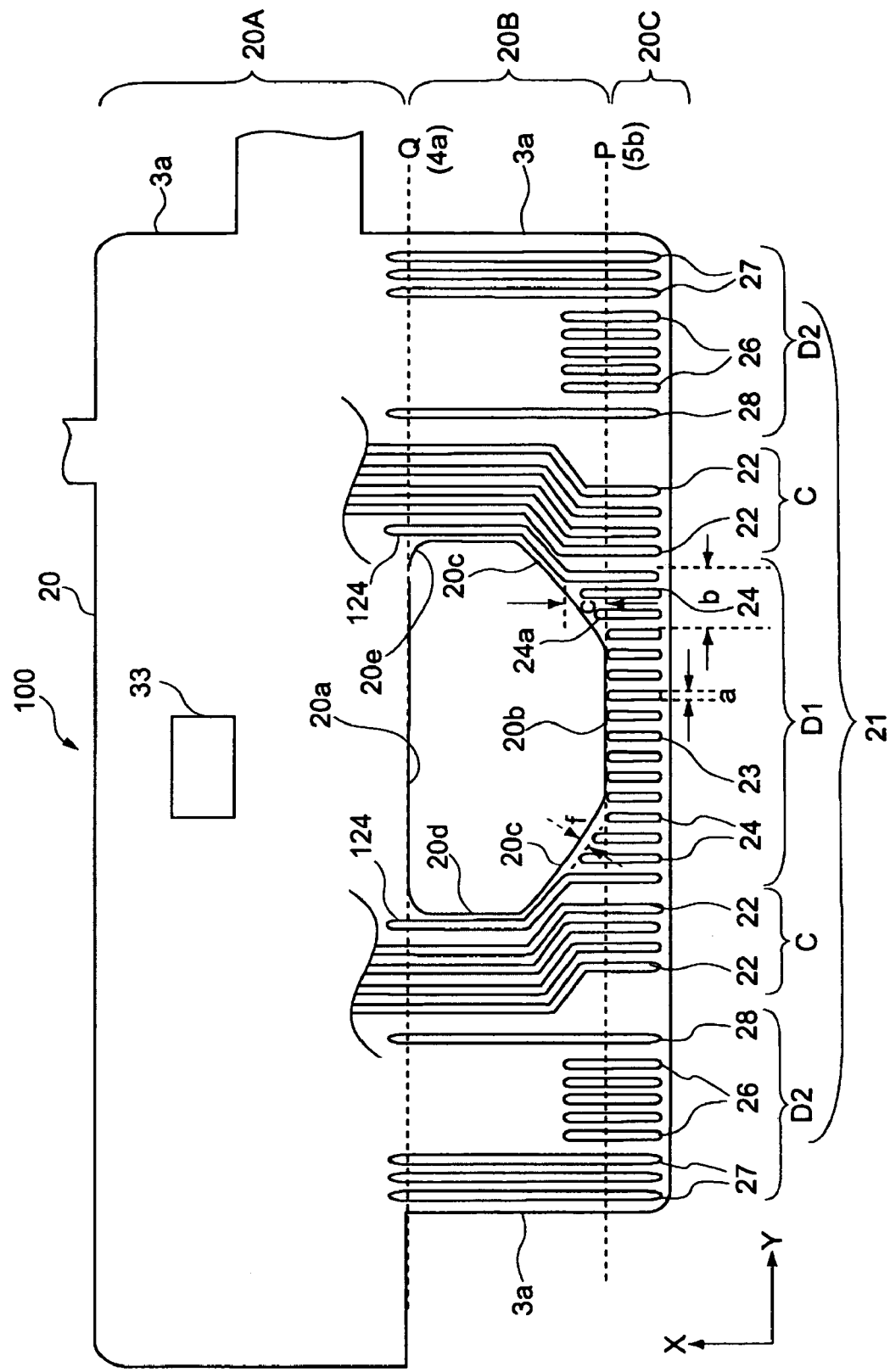
FIG. 9 is a schematic plan view illustrating a circuit board which is used in a liquid crystal display device of a first modification according to the invention.

FIG. 9 is a schematic plan view illustrating a circuit board which is used in a liquid crystal display device of the first modification according to the invention.

In the present modification, a circuit board 100 includes dummy wiring lines 124 in place of the dummy wiring lines 24 and 25 which are closest to the wiring lines 22 among the plurality of dummy wiring lines 24 of the first embodiment. The dummy wiring line 124 is formed by connecting the dummy wiring line 24, which is closest to the wiring lines 22 among the plurality of dummy wiring lines 24 of the first embodiment, to the dummy wiring line 25. The dummy wiring lines 124 are provided in the vicinity of the opening 20a across the end portion 20C to the mounting portion 20A along an inclined end edge 20c and an opening edge 20d of the opening 20a.

When the dummy wiring lines 24 and the dummy wiring lines 25 are separately provided as in the first embodiment, the region between the dummy wiring lines 24 and the dummy wiring lines 25 cannot be reinforced. According to the present modification, however, the dummy wiring line 124 has a shape where the above-described dummy wiring line 24 extends to be connected to the dummy wiring lines 25. Therefore, the region between the dummy wiring lines 24 and the dummy wring lines 25 can also be reinforced, and the wiring lines 22 can be more reliably prevented from being broken from the side of the opening 20a. In addition, since the pattern shape is simple, a pattern forming process becomes simplified, and accordingly, the circuit board can be easily manufactured, which reduces manufacturing cost.

Second Modification

Figure 10:
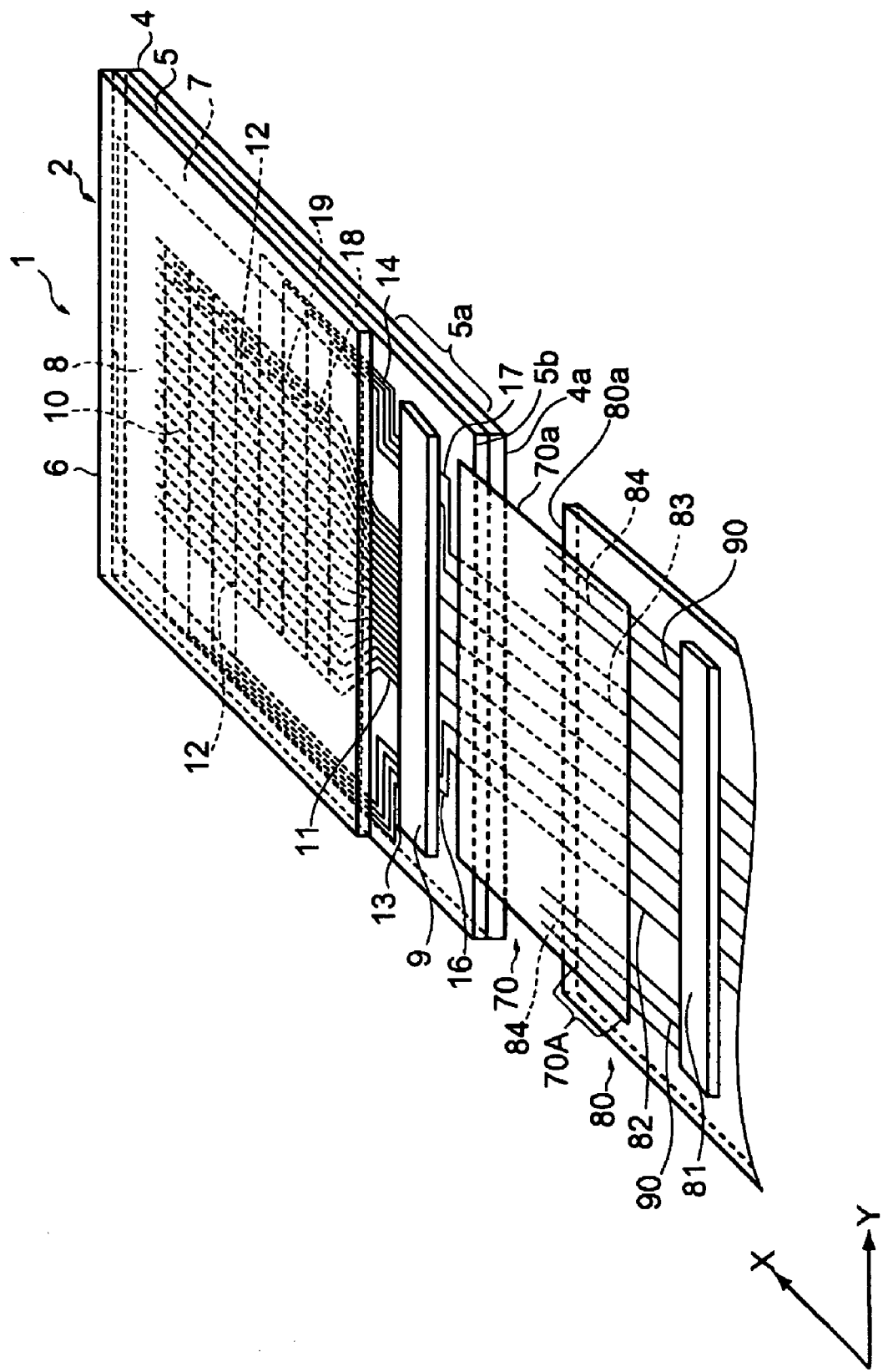
FIG. 10 is a schematic perspective view illustrating a liquid crystal display device of a second modification according to the invention.

FIG. 10 is a schematic perspective view illustrating a liquid crystal display device of the second modification according to the invention.

In the above-described embodiments and modification, it has been exemplified that the mounting portion 20A of the circuit board 3 was bent toward the bottom surface of the liquid crystal panel 2. In the present modification, however, one end of a circuit board 70 having flexibility is connected to the substrate 5 of the liquid crystal panel 2, and the other end 70A of the circuit board 70 is connected so as to overlap an end edge 80a of another substrate 80. At this time, the end edge 80a of the substrate 80 crosses the edge 70a of the circuit board 70. Hereinafter, the description on the connection between the circuit board 70 and the substrate 5 is omitted because it is the same as that of the first embodiment, and the connection between the circuit board 70 and the substrate 80 will be described.

A driving IC 81 is provided on the substrate 80, and output terminals (not shown) of the driving IC 81 are connected to wiring lines 82 and dummy wiring lines 90 on the substrate 80. At ends of the wiring lines 82 and the dummy wiring lines 90 opposite to the driving IC 81, connection terminals (not shown) are provided.

In the end portion 70A of the circuit board 70, a plurality of wiring lines 83 and a plurality of dummy wiring lines 84 are provided in the X direction.

One end of each of the wiring lines 83 is connected to the wiring lines 16 and 17 on the substrate 5 through an ACF or the like, and the other ends thereof are connected to the connection terminals of the wiring lines 82 through an ACF or the like.

The dummy wiring lines 84, having connection terminals provided in the end portion 70A, extend in the X direction from the connection terminals. In other words, the dummy wiring lines 84 are provided from the end portion 70A toward the liquid crystal panel 2 with each of the dummy wiring lines 84 crossing the end edge 80a, in a region between the wiring lines 83 and a portion where the end edge 80a of the substrate 80 and the edge 70a of the circuit board 70 cross each other.

According to the present modification, the dummy wiring lines 84 are provided from the end portion 70A toward the liquid crystal panel 2 with each of the dummy wiring lines 84 crossing the end edge 80a, in a region between the wiring lines 83 and a portion where the end edge 80a of the substrate 80 and the edge 70a of the circuit board 70 cross each other. Therefore, even though load applied to the substrate 80 is increased by an external force or the like, the region between the wiring lines 83 and the crossing portion can be reinforced by the dummy wiring lines 84, and the circuit board 70 can be prevented from being broken from the crossing portion, which makes it possible to prevent the wiring lines 83 from being broken.

In the present modification, it is exemplified that the wiring lines 83 are provided to cross the end edge 5b of the substrate 5 and the end edge 80a of the substrate 80.

However, the wiring lines crossing the end edge 5*b* are different from the wiring lines crossing the end edge 80*a*. Therefore, even when these different wiring lines are connected through electronic components on the circuit board 70, they can be similarly reinforced by the dummy wiring lines 84 or the like.

In addition, this invention may be applied when only the substrate 5 is connected to the circuit board 70 or when only the substrate 80 is connected to the circuit board 70.

Third Modification

Figure 11:
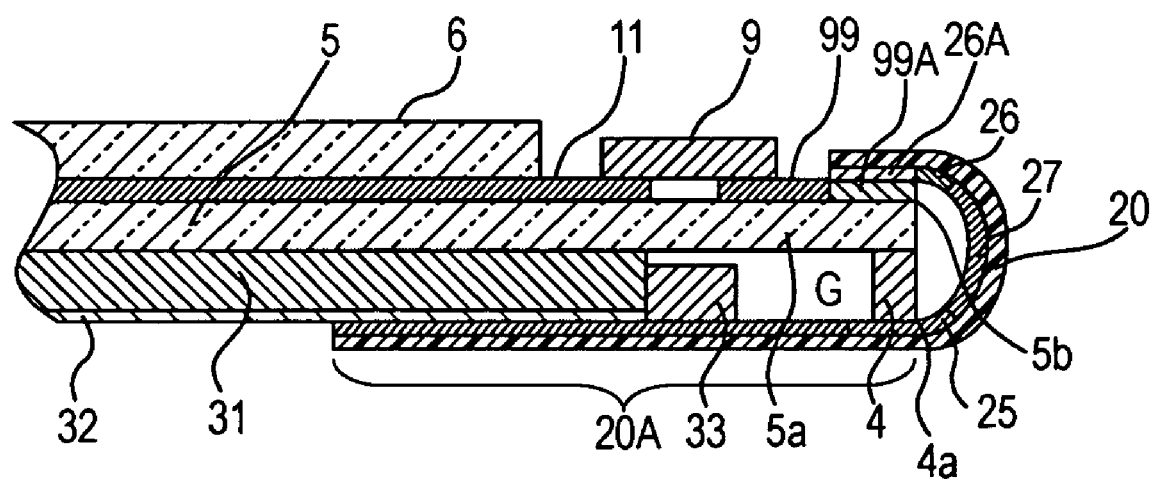
FIG. 11 is a cross-sectional view illustrating the liquid crystal device 1 shown in FIG. 1 taken along the line XI—XI.

FIG. 11 is a cross-sectional view illustrating the liquid crystal display device 1 shown in FIG. 1 taken along the line XI—XI.

One end of each of the wiring lines 99 is connected to the corresponding input terminal (not shown) of the liquid crystal driving IC 9 through an ACF or the like, and the other end of each of the wiring lines 99 is provided with a terminal 99A. Dummy wiring lines 26 provided on the FPC substrate 20 include terminals 26A serving as second terminals on the end portion of the FPC substrate 20. The terminals 99A and the terminals 26A are electrically connected to each other through an ACF or the like. In other words, the dummy wiring lines 26 are formed to extend from the terminals 26A. The dummy wiring lines 27 and 28 are also formed to extend from the terminals (not shown) of the dummy wiring lines 27 and 28, similar to the dummy wiring lines 26.

According to the present modification, the dummy wiring lines 26 including the terminals 26A are formed to extend from the terminals 26A. Therefore, the substrate 5 and the FPC substrate 20 can be reliably connected between the terminals 99A and the terminals 26A through an ACF or the like by using the terminals 99A and 26A, and the dummy wiring lines 26 or the like having the terminals 26A can be used to reinforce the wiring lines 22.

Fifth Embodiment and Electronic Apparatus

Next, an electronic apparatus according to the fifth embodiment of the invention including the above-described liquid crystal display device 1 will be described.

Figure 12:
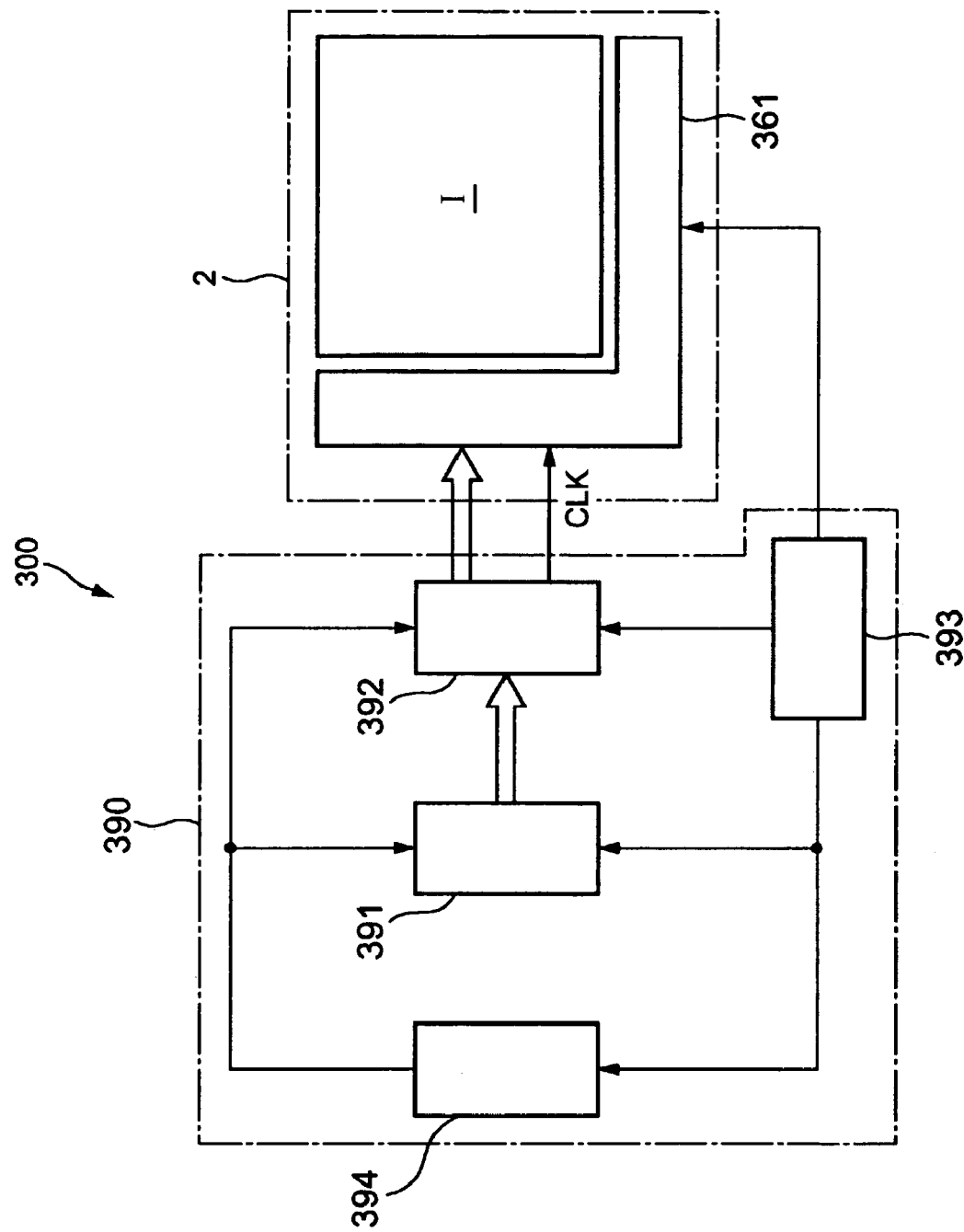
FIG. 12 is a block diagram illustrating an electronic apparatus of a fifth embodiment according to the invention.

FIG. 12 is a schematic diagram showing an overall configuration of display control system of the electronic apparatus according to the fifth embodiment of the invention.

The electronic apparatus 300 includes the liquid crystal panel 2, a display control circuit 390, and the like as a display control system, as shown in FIG. 12. The display control circuit 390 has a display information output source 391, a display information processing circuit 392, a power supply circuit 393, a timing generator 394, and the like.

Further, the liquid crystal panel 2 has a driving circuit 361 including the liquid crystal driving IC 9 for driving a display region I.

The display information output source 391 includes a memory composed of ROM (Read Only Memory) or RAM (Random Access Memory), a storage unit composed of a magnetic recording disc or an optical recording disc, and a tuning circuit which tunes to output a digital image signal. Further, the display information output source 391 supplies displayed information to the display information processing circuit 392, on the basis of various clock signals generated by the timing generator 394. The display information is supplied in the form of an image signal having a predetermined format.

Furthermore, the display information processing circuit 392 includes various known circuits such as a serial-to-parallel conversion circuit, an amplifying and inverting circuit, a rotation circuit, a gamma corrector, a clamp circuit, and the like. The display information processing circuit 392 executes processing of input display information so as to supply the image information and clock signals CLK to the driving circuit 361. In addition, the power supply circuit 393 supplies a predetermined voltage to each of the above-described constituent components.

According to the present embodiment, in the liquid crystal panel 2 included in the electronic apparatus 300, the wiring lines 22 provided on the substrate 5 can be reinforced by the dummy wiring lines 27 or the like to prevent them from being broken. Therefore, such an electronic apparatus having an excellent display performance can be obtained.

As a specific electronic apparatus, there are exemplified a touch panel, a projector, a liquid crystal television, a viewfinder-type or monitor-direct-view-type video tape recorder, a car navigation device, a pager, an electronic organizer, an electronic calculator, a word processor, a work station, a video phone, a POS terminal, and the like, which have the liquid crystal display device mounted thereon, in addition to a cellular phone or a personal computer. Further, it is needless to mention that the above-described display device 1 can be applied as display units of the respective electronic apparatuses.

The electronic apparatus of the invention is not limited to the above-described examples, but various modifications can be made within the scope without departing from the spirit of the present invention. Further, the above-described examples may be combined within the scope without departing from the spirit of the present invention.

For example, in the above-described embodiment, the TFD-type liquid crystal display device 1 has been described, but the invention is not limited thereto. For example, a TFT (Thin Film Transistor) active-matrix-type or passive-matrix-type liquid crystal display device may be used. Further, transmissive type or reflective type may be used, without being limited to the transflective type. In addition, any one of the above-described electro-optical devices is a liquid crystal display device having a liquid crystal panel but may be one of various electro-optical devices such as an inorganic or organic electroluminescent device, a plasma display device, an electrophoretic display device, a device using an electron emission element (Field Emission Display or Surface-Conduction Electron-Emitter Display), and the like.

In the above-described embodiments and the first modification, it has been exemplified that the substrate 5 and the circuit board 3 are connected to each other and the mounting portion 20A of the circuit board 3 is disposed to overlap the frame 4 at the bottom surface side of the frame 4. However, the invention is not limited thereto. For example, when only the substrate 5 and the circuit board 3 are connected to each other, or even when only the frame 4 and the circuit board 3 are disposed to overlap each other, the invention can be applied. For example, when only the frame 4 and the circuit board 3 are disposed to overlap each other, only the dummy wiring lines 25 may be provided. Even in this case, the wiring lines 22 or the like can be similarly prevented from being broken.

In the above-described embodiments and the modifications, it has been exemplified that the dummy wiring lines 23 to 28, 46, and 52 to 56 are provided on the circuit boards 3, 41, and 50, respectively, as shown in FIG. 4. However, the invention is not limited thereto. For example, the respective dummy wiring lines may be independently provided on the respective circuit boards.

In the above-described embodiments and the modifications, it has been exemplified that the dummy wiring lines 27 and 28 are used to prevent the wiring lines 22 or the like from being broken. However, the invention is not limited thereto. For example, even though reinforcing members using an insulating material are provided instead of the dummy wiring lines 27 or the like, the wiring lines 22 can be prevented from being broken. In addition, the reinforcing member using an insulating material may have substantially the same shape as the dummy wiring lines, for example.

In the above-described embodiments and the modifications, it has been exemplified that the dummy wiring lines 27 and 28 or the like are not conductive wiring lines. However, the invention is not limited thereto. For example, the dummy wiring lines may be electrically connected to conductive wiring lines at proper places. In other words, the dummy wiring lines which are electrically connected to conductive wiring lines may be used to prevent conductive wiring lines from being broken.

What is claimed is:

1. An electro-optical device comprising:
a first substrate having an end edge of the first substrate;
a flexible second substrate that overlaps the end edge of the first substrate, the flexible substrate includes:
an end portion of the flexible second substrate;
an edge of the flexible second substrate crossing the end edge of the first substrate; and
a plurality of first wiring lines crossing the end edge of the first substrate; and
first reinforcing dummy wirings provided on the flexible second substrate, the first reinforcing dummy wirings crossing the end edge of the first substrate at a position between the plurality of first wiring lines and the edge of the flexible second substrate.

2. The electro-optical device according to claim 1, wherein the first reinforcing dummy wirings are provided in the direction orthogonal to the direction along the end edge of the first substrate.

3. The electro-optical device according to claim 1, wherein the first reinforcing dummy wirings have an island shape.

4. The electro-optical device according to claim 1, wherein the edge of the second substrate defines an opening in the second substrate.

5. The electro-optical device according to claim 4, wherein the edge of the second substrate is continuous with an inclined edge that is inclined with respect to the end edge of the first substrate; and
ends of the first reinforcing dummy wirings are arranged along the inclined edge.

6. The electro-optical device according to claim 4, wherein the opening has corner portions and the first reinforcing dummy wirings are provided adjacent to the corner portions.

7. The electro-optical device according to claim 1, further comprising:
a frame that supports the first substrate and has an end frame edge, the second substrate being bent to overlap the end frame edge; and
a second reinforcing member that is provided on the second substrate, the second reinforcing member crossing the end frame edge at a position between the plurality of first wiring lines and the edge of the second substrate.

8. The electro-optical device according to claim 1, further comprising:
a third substrate having an end edge of the third substrate, the third substrate connected to the flexible second substrate at the end portion of the flexible second substrate; and
a third reinforcing member that is provided on the flexible second substrate, the third reinforcing member crossing the end edge of the third substrate between the wiring lines and the edge of the flexible second substrate.

9. An electro-optical device comprising:
a frame having an end edge of the frame;
a flexible substrate that overlaps the end edge of the frame, the flexible substrate includes:
an edge of the flexible substrate crossing the end edge of the frame; and
a plurality of wiring lines crossing the end edge of the frame; and
a reinforcing dummy member provided on the flexible substrate, the reinforcing dummy member crossing the end edge of the frame at a position between the plurality of wiring lines and the edge of the flexible substrate.

10. A mounting structure comprising:
a first substrate having an end edge of the first substrate;
a flexible second substrate that is connected to the first substrate so as to overlap the end edge of the first substrate, the flexible second substrate includes:
an edge of the flexible second substrate overlapping the end edge of the first substrate; and
a plurality of wiring lines crossing the end edge of the first substrate; and
first reinforcing dummy wirings provided on the second flexible substrate, the first reinforcing dummy wirings crossing the end edge of the first substrate at a position between the plurality of wiring lines and the edge of the second substrate.

11. An electronic apparatus comprising the electro-optical device according to claim 1.

12. An electro-optical device comprising:
a frame having a frame edge;
a first substrate mounted to the frame, the first substrate having a substrate edge;
a flexible second substrate including:
a mounting portion mounted to the frame;
an end portion opposite to the mounting portion and mounted to the first substrate;
a bent portion between the mounting portion and the end portion, the bent portion extending between the frame edge and the substrate edge;
a plurality of wiring lines extending from the mounting portion to the end portion; and
a plurality of dummy wirings extending from the bent portion to the end portion.

13. The electro-optical device of claim 12, wherein the dummy wirings extend from the mounting portion to the end portion.

14. An electro-optical device comprising:
a frame having a frame edge;
a first substrate mounted to the frame, the first substrate having a substrate edge;
a flexible second substrate including:
a mounting portion mounted to the frame;
an end portion opposite to the mounting portion and mounted to the first substrate;
a bent portion between the mounting portion and the end portion, the bent portion extending between the frame edge and the substrate edge;
a plurality of wiring lines extending from the mounting portion to the end portion; and
a plurality of dummy wirings extending from the mounting portion to the bent portion.

15. An electro-optical device comprising:
a frame having a frame edge;
a first substrate mounted to the frame, the first substrate having a substrate edge;
a flexible second substrate including:
   a mounting portion mounted to the frame;
   an end portion opposite to the mounting portion and mounted to the first substrate;
   a bent portion between the mounting portion and the end portion, the bent portion extending between the frame edge and the substrate edge;
a plurality of wiring lines extending from the mounting portion to the end portion; and
a plurality of dummy wirings confined to the end portion of the flexible second substrate.

16. An electro-optical device comprising:
a frame having a frame edge;
a first substrate mounted to the frame, the first substrate having a substrate edge;
a flexible second substrate including:
   a mounting portion mounted to the frame;
   an end portion opposite the mounting portion and mounted to the first substrate;
   a bent portion between the mounting portion and the end portion, the bent portion including an intermediate edge that is between the mounting portion and the end portion;
a wiring line extending from the mounting portion to the end portion; and
a dummy wiring positioned between the intermediate edge and the wiring line, the dummy wiring extending from the bent portion to the end portion.

* * * * *